United States Patent [19]

Ernyei

[11] 4,342,015
[45] Jul. 27, 1982

[54] ELECTROMECHANICAL BAND PASS FILTERS

[75] Inventor: Herbert Ernyei, Conflans Ste Honorine, France

[73] Assignee: Lignes Telegraphiques et Telephoniques, Conflans Ste Honorine, France

[21] Appl. No.: 169,655

[22] Filed: Jul. 17, 1980

[30] Foreign Application Priority Data

Jul. 18, 1979 [FR] France .................... 79 18570

[51] Int. Cl.$^3$ .................... H03H 9/24; H03H 9/50
[52] U.S. Cl. .................... 333/197; 333/186
[58] Field of Search .................... 333/186, 197–198

[56] References Cited

U.S. PATENT DOCUMENTS 4,163,960  8/1979  Ernyei et al. .................... 333/198
4,197,516  4/1980  Ernyei et al. .................... 333/198

Primary Examiner—Marvin L. Nussbaum

[57] ABSTRACT

An electromechanical band pass filter includes a plurality of cells in cascade. Each cell comprises two parallel cylindrical bars forming longitudinally vibrating resonators and a flexurally vibrating cylindrical coupler connected between the two resonators. The cell of rank i is dimensioned such that one of its relative limiting frequencies is linked with the frequency of a cell for an electrical low-pass filter by the relationship:

$$f_i^+ = \frac{A}{\sin\alpha_{ci} + \sinh\alpha_{ci}} \left[ \frac{\tan\alpha_{ri}}{\sqrt{\Omega^L_i}} (1 - \cos\alpha_{ci}\cosh\alpha_{ci}) - 2.539 (\Omega^L_i - 1)(\sin\alpha_{ci}\cosh\alpha_{ci} + \cos\alpha_{ci}\sinh\alpha_{ci}) \right]$$

4 Claims, 4 Drawing Figures

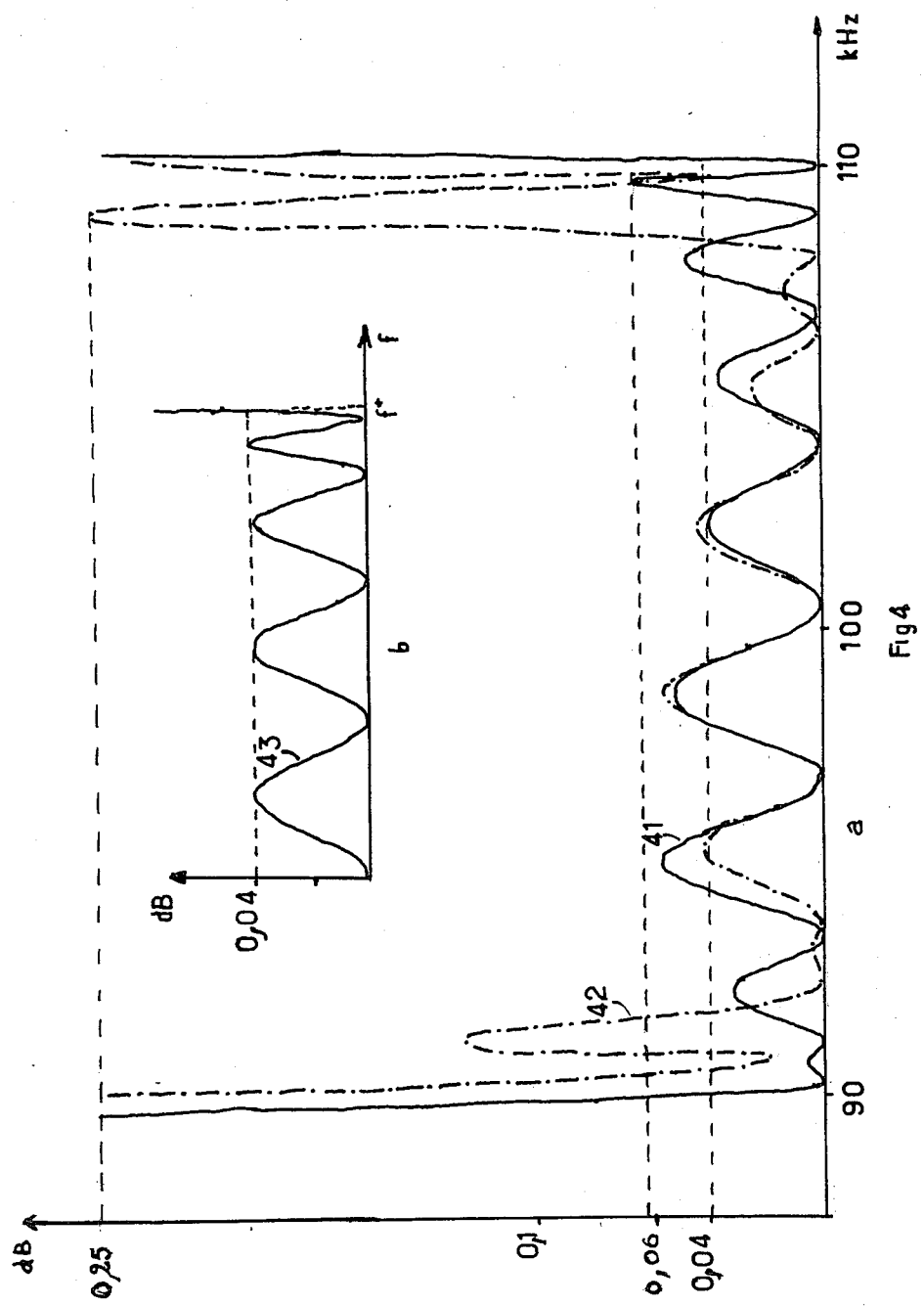

ELECTROMECHANICAL BAND PASS FILTERS

BACKGROUND OF THE INVENTION

The present invention relates to electromechanical filters comprising longitudinally vibrating bars associated with flexurally vibrating couplers. This type of filters is described in U.S. Pat. Nos. 4,163,960 for "Electromechanical filter structure" and 4,197,516 for "Bridged electromechanical filters", both assigned to the same Assignee as the present application, and U.S. patent application Ser. No. 167,702, filed on July 11, 1980 by the Assignee for "Electromechanical filter cells".

The last-mentioned document relates to an elemental cell which has the main advantage of having a band width very near to that of its electrical equivalent, even when the relative band width reaches a value of several tenths.

The present invention has essentially for its object an electromechanical band-pass filter produced by arranging in cascade elemental cells in which the undulation in the transmitted frequency band is reduced with respect to the value of said undulation obtained for filters calculated in accordance with the prior art and based on the theory of electrical filters. It can advantageously be used with filters according to the last-mentioned document and in this case makes it possible to obtain both the desired band width, even a broad band width, and a particularly advantageous transmission characteristic in the band. The realisation of the invention makes it possible to obtain filters, whose residual undulation in a relative band of 20% exceeds by 0.02 dB that of a prototype low frequency filter.

The present invention more particularly relates to the choice of band width of each of the elemental cells constituting the mechanical filter.

For the purposes of the invention, it is assumed that the different stages leading to the obtention of an electromechanical filter are known. Basically, the manufacturer synthesizes an electromechanical filter on the basis of data (central frequency, band width, attenuation out of the band, etc . . . ) defined by a model. The results of the study of the electrical filter are then transported to the mechanical field by applying a system of equivalence between electrical and mechanical magnitudes which are well known in the art. Without going into detail of the theory of filters, it is useful to point out the meaning of certain terms used hereinafter. The theory of filters reduces the study of the desired type filter (e.g. polynominal band-pass) to that of a low-pass filter called a prototype low-pass filter. This prototype filter comprises a cascade of low-pass cells, each being defined by a maximum limiting frequency beyond which transmission is attenuated. The basic electric cells forming the filter having the desired characteristics are obtained from the cells of the prototype filter by a simple mathematical conversion (corresponding to a change of the variable linked with the frequency). By analogy with the cell of the prototype low-pass filter, the band width of a filter cell is defined as the range of frequencies converted from the frequencies limiting the band of the prototype filter cell by the change of variable referred to hereinbefore. In the case of a complete filter obtained by arranging the cells in cascade form, said cells usually being of the same type, the response in the passband is defined by the type of approximation used for the design of the filter (Butterworth, Chebyshev, etc . . . ) on the basis of the attenuation characteristic of the complete filter. The abutment for the attenuation characteristic is the model to be respected. This last condition makes it possible to define, taking account of the selected approximation type, the relationship of the impedances of the branches of the cells of the prototype low-pass filter and, due to the conversion of the variable, that of the cells of the corresponding electrical filter (e.g. band-pass filter). The electromechanical equivalence then makes it possible to obtain the characteristic magnitudes of the equivalent mechanical filter.

As is known, the theory of filters often leads to results which can only be used with great difficulty and it is a conventional practice to make approximations for simplification purposes. As a result of these approximations, real characteristics are obtained which can have an inadmissible deviation compared with the desired characteristic.

BRIEF SUMMARY OF THE INVENTION

The present invention consists of a direct relationship between one of the limiting frequencies of a cell of the mechanical filter and the limiting frequency of the cell of the associated prototype electrical low-pass filter without recourse to the cell of the basic electrical filter making it possible to obtain an improved characteristic in the transmitted band, said improvement relating to the undulation amplitude.

More specifically, each elemental cell of rank i of an electromechanical band pass filter according to the invention, including two parallel cylindrical bars forming longitudinally vibrating resonators and a flexurally vibrating cylindrical coupler connected between the two resonators, is dimensioned such that one of the relative limiting frequencies ($\Omega_i^L$) of its frequency band ($\Omega_i^- - \Omega_i^+$) is linked with the limiting frequency ($f_i^+$) of a cell of a low-pass electrical filter called a prototype low-pass filter corresponding to the electromechanical filter to be produced by the relationship.

$$f_i^+ = \frac{A}{\sin\alpha_{ci} + \sinh\alpha_{ci}} \left[ \frac{\tan\alpha_{ri}}{\sqrt{\Omega_i^L}} (1 - \cos\alpha_{ci}\cosh\alpha_{ci}) - 2.539 (\Omega_i^L - 1)(\sin\alpha_{ci}\cosh\alpha_{ci} + \cos\alpha_{ci}\sinh\alpha_{ci}) \right] \quad (1)$$

where A is a constant $$\alpha_{ci} = \frac{3\pi}{4} \sqrt{\Omega_i^L} \cdot \frac{l_c}{l_o}$$

where $l_c$ is the length of the coupler and $l_o$ is the length of the coupler corresponding to a quarter wave effect at the central frequency of the band of frequencies to be transmitted by the electromechanical filter, $\alpha_{ri} = 2\pi n_r \Omega_i^L m$ where m is the order of the vibration mode and where $n_r = (l_r/\lambda_o)$ with $l_r$ the length of the resonators and $\lambda_o$ the wavelength at the tuning frequency of the resonators in longitudinal vibration.

The most commonly used filters comprise $\lambda/4$ couplers, so that $l_c = l_o$ and $\lambda/2$ resonators vibrating on the fundamental mode $n_r = \frac{1}{2}$ and $m = 1$ and thus giving:

$$a_{ci} = \frac{3\pi}{4} \sqrt{\Omega_i^L} \text{ and}$$

$$a_{ri} = \pi\Omega_i^L$$

Experience has shown that in the case of symmetrical characteristics, it is preferable to use as relative limiting frequency of the frequency band $(\Omega^-_i - \Omega^+_i)$ of the cell of rank i the lower relative frequency $\Omega^-_i$ of said band.

BRIEF DESCRIPTION OF THE DRAWINGS

The invention is described in greater detail hereinafter relative to non-limitative embodiments and the attached drawings, wherein show:

FIG. 4 a number of curves making it possible to compare the attenuation characteristic of the filter of FIG. 3 with that of a prior art filter.

DETAILED DESCRIPTION OF THE PREFERRED EMBODIMENTS

Figure 1:
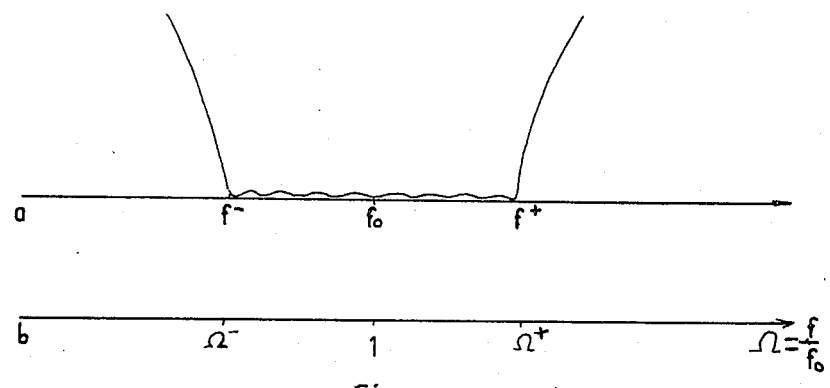
FIGS. 1 and 2 the definition of certain magnitudes used hereinafter.

FIG. 1 shows respectively in (a) and (b) the axis of frequencies f and that of the relative frequency $\Omega = f/f_o$, $f_o$ being the central frequency of the filter which must transmit the frequencies between $f^-$ and $f^+$ and attenuate the other frequencies. This is indicated by the attenuation curve of FIG. 1a. $\Omega^-$ corresponds to the relative value of the lower limit $(f^-/f_o)$ of the pass-band and $\Omega^+$ corresponds to the relative value of the upper limit $(f^+/f_o)$ of the pass-band.

Figure 2:
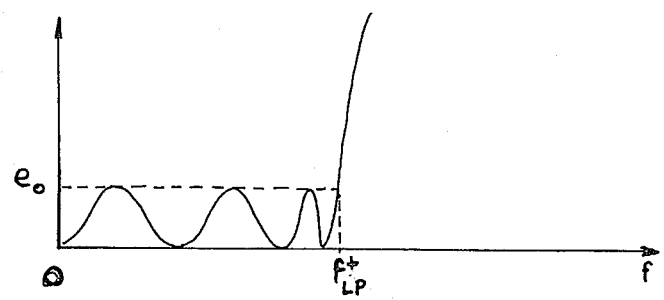

FIG. 2 shows the amplitude—frequency response of a low-pass filter, such as the prototype low-pass filter of the mechanical filter to be obtained. In the Chebyshev approximation, the upper limit frequency $f_{LP}{}^+$ of the prototype low-pass filter is defined by the intersection of the attenuation characteristic and the parallel on the abscissa axis passing through the apex of the undulations of said curve in the band, said approximation consisting of selecting them of equal amplitude in the band. This amplitude is represented by $e_o$. The definition of $f_{LP}{}^+$ is linked with the selected approximation type, as it is known in the art. It is known, as described in the work by TEMES and MITRA entitled "Modern filter theory and design", page 23 of the 1973 edition published by John WILEY, that the attenuation characteristic of a cell of an electrical band-pass filter corresponding to the prototype low-pass filter is given by the same function of a new variable defined by $$\omega_{LP} = A \frac{\omega_2{}^2 - \omega^2}{-\omega}$$

where $\omega_{LP}$ is the pulsation of the prototype low-pass filter cell, A is a positive constant, $\omega_2$ is the pulsation of the central frequency of the band-pass filter and $\omega$ the pulsation of the corresponding band-pass filter. Other changes of the variable make it possible to pass from the prototype filter to any other desired electrical filter according to the prior art. On obtaining the characteristics of the electrical band-pass filter cells the use of a system of equivalence makes it possible to obtain the characteristic magnitudes of the electromechanical filter cells.

The present invention essentially relates to band-pass electromechanical filters, each of which is derived from a prototype electrical low-pass filter constituted by the arrangement in cascade of cells, whose individual pass-bands are defined by an approximation selected from among those known in the art, in which the cells of the mechanical filter correspond to the cells of the prototype electrical low-pass filter so as to fulfil the condition $f_i{}^+ = A\gamma(\Omega_i^L)$ where $f_i{}^+$ is the limiting frequency of the cell of rank i of the prototype electrical low-pass filter, $\Omega_i^L$ is a relative limiting frequency of the pass-band of the cell of rank i of the mechanical filter (preferably the lower limiting frequency) and the function $\gamma$ is defined by $$\gamma(\Omega_i^L) = \frac{1}{\sin a_{ci} + \sinh a_{ci}} \left[ \frac{\tan a_{ri}}{\sqrt{\Omega_i^L}} (1 - \cos a_{ci} \cosh a_{ci}) \right.$$

$$\left. - 2.539 (\Omega_i^L - 1)(\sin a_{ci} \cosh a_{ci} + \cos a_{ci} \sinh a_{ci}) \right]$$

where $a_{ri} = \pi \Omega_i^L$ for a longitudinally vibrating $\lambda/2$ resonator and $$a_{ci} = \frac{3\pi}{4} \sqrt{\Omega_i^L}$$

for a flexurally vibrating $\lambda/4$ coupler, A being a constant whose value is:

$$A = \frac{f_{LP}{}^+}{\gamma(\Omega^L)}$$

where $\Omega^L = f^L/f_o$ is a relative limiting frequency of the band transmitted by the mechanical filter as shown in FIG. 1b, and preferably the lower relative frequency, i.e. $\Omega^- = f^-/f_o$.

$f_{LP}{}^+$ is the limiting frequency of the band transmitted by the prototype electrical low-pass filter, as shown in FIG. 2.

Figure 3:
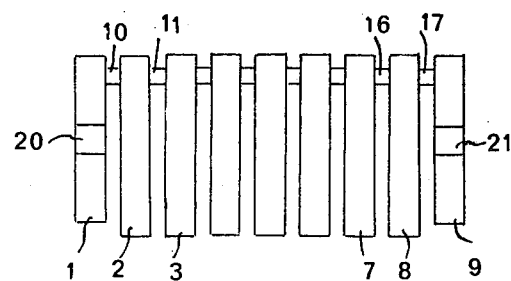
FIG. 3 a diagrammatic representation of an example of a filter according to the invention.

FIG. 3 diagrammatically shows an electromechanical band pass filter having nine parallel cylindrical bars forming longitudinally vibrating resonators (1 to 9) and coupled by eight flexurally vibrating cylindrical couplers (10 to 17). The extreme resonators 1 and 9 respectively carry reversible electromechanical transducers 20 and 21 connected to the input and output terminals (not shown) of the filter.

Two filters of the type shown in FIG. 3 have been constructed with a relative pass-band of 20% and a central frequency of 100 kHz in accordance with the Chebyshev approximation.

The first, whose characteristic is shown by curve 42 in FIG. 4a is a realisation of U.S. Patent Application filed an July, 1980 by the Assignee for "Electromechanical filter cells". This filter comprises nine resonators constituted by identical Elinvar bars (diameter 3.5 mm, length 24 mm) longitudinally vibrating under the action of transducers constituted by piezoelectric ceramics with a diameter of 2.5 mm, a thickness of 3 mm and a length of 19 mm. The resonators are coupled by couplers of the same material and of identical length (1.10 mm), whose different diameters are between 1.38 and 1.42 mm.

The second, whose characteristic is the curve 41 of FIG. 4a has been constructed in accordance with the present invention. The transducers and the material forming the two filters are identical. The resonators comprise bars of length 24 mm and diameter between 3.50 and 3.55 mm. The couplers are made from Elinvar and have a length of 1.10 mm and a diameter between 1.40 and 1.44 mm.

The comparison between curves 41 and 42 shows that the large amplitude undulations of curve 42 at the ends of the transmitted band have disappeared on curve 41 of the filter according to the invention. The maximum amplitude of the undulations of curve 41 is 0.06 dB. Curve 43 in FIG. 4b is the transmission characteristic of the prototype electrical low-pass filter used for the basic design of the two filters compared. The common amplitude of the undulations is 0.04 dB, i.e. very near to the average amplitude of the undulations of curve 41 which remain between 0.03 and 0.062 dB, whilst those of curve 42 reach 0.25 dB.

The determination of a mechanical filter according to the invention is performed in the following way.

The frequency response of the mechanical filter to be produced is defined by the data $f_o$, $f^-$ (FIG. 1a), so that $\Omega^- = f^-/f_o$ (FIG. 1b) and, in the case of the Chebyshev approximation, by the undulation in the pass-band ($e_o$ in FIG. 2). If another approximation is chosen, another curve configuration is obtained.

The degree d of the filter (number of cells) is fixed as a function of the sought characteristics in the attenuated band, as is known in the art.

The synthesis of the prototype electrical low-pass filter of degree d, attenuation $e_o$ and band limiting frequency $f_{LP}^+$ is performed by applying known methods. The constant A is calculated by formula (2).

Formula (1) makes it possible to determine the relative limiting frequencies and preferably the lower relative frequency $\Omega_i^-$ of the pass-band of each of the cells of the band-pass mechanical filter on the basis of the maximum frequency $f_i^+$ of each of the cells of the prototype electrical low-pass filter by calculating the inverse relationship. The definition of the elemental cells of the mechanical filter is limited to one condition (low limiting frequency). Other conditions (single material, single length of one of the elements) are explained by the definition of certain parameters of the elements: couplers and resonators, the others being chosen by the manufacturer.

According to a preferred embodiment, the ratio between the diameters of the resonators and the couplers is defined by the relationship forming the subject matter of U.S. Patent Application filed on July, 1980 by the Assignee for "Electromechanical filter cells", which makes it possible to obtain an optimization of the band width of each cell. In the most frequently encountered case of $\lambda/2$ resonators and $\lambda/4$ coupler and where $x_i$ is the coupling coefficient of the cell of rank i this relationship is:

$$x_i = \frac{\tan \pi \Omega_i^-}{\sqrt{\Omega_i^-}} \cdot \frac{1 - \cos\alpha_i^- \cosh\alpha_i^-}{\sin\alpha_i^- \sinh\alpha_i^- + \cos\alpha_i^- \cosh\alpha_i^- + \sin\alpha_i^- + \sinh\alpha_i^-}$$

where $\alpha_i^- = \frac{3\pi}{4} \sqrt{\Omega_i^-}$.

This relationship makes it possible to determine the diameter of the coupler as a function of the diameter of the resonators for each cell.

What is claimed is:

1. An electromechanical band pass filter comprising a plurality of cells in cascade, each cell including:
   two parallel cylindrical bars forming longitudinally vibrating resonators; and
   a flexurally vibrating cylindrical coupler connected between said two resonators, wherein the cell of rank i is dimensioned such that one of the relative limiting frequencies ($\Omega^L_i$) of its frequency band ($\Omega_i^- - \Omega_i^+$) is linked with the limiting frequency ($f_i^+$) of a cell for an electrical low-pass filter corresponding to said electromechanical filter to be obtained by the relationship:

$$f_i^+ = \frac{A}{\sin\alpha_{ci} + \sinh\alpha_{ci}} \left[ \frac{\tan\alpha_{ri}}{\sqrt{\Omega^L_i}} (1 - \cos\alpha_{ci} \cosh\alpha_{ci}) - 2.539 (\Omega^L_i - 1)(\sin\alpha_{ci}\cosh\alpha_{ci} + \cos\alpha_{ci}\sinh\alpha_{ci}) \right]$$

where:
A is a constant $$\alpha_{ci} = \sqrt[4]{\Omega_i^L} \cdot \frac{l_c}{l_o}$$

where $l_c$ is the length of said coupler and $l_o$ the length of said coupler corresponding to a quarter wave effect at the central frequency of the band of frequencies to be transmitted by said electromechanical filter $\alpha_{ri} = 2\pi n_r \Omega_i^L m$ where m is the order of the vibration mode and where $n_r = (l_r/\lambda_o)$ with $l_r$ the length of said resonators and $\lambda_o$ the wavelength at the tuning frequency of said resonators in longitudinal vibration.

2. An electromechanical band pass filter as claimed in claim 1, wherein said relative limiting frequency ($\Omega_i^L$) is the lower limiting frequency ($\Omega_i^-$) of said frequency band of said cell of rank i.

3. An electromechanical band pass filter as claimed in claim 1, wherein said resonators are half-wave resonators and said coupler is a quarter-wave coupler.

4. An electromechanical band pass filter as claimed in claim 1, wherein it comprises input and output electromechanical transducers associated with said cells in cascade form.

* * * * *